(12) United States Patent
Dal Gazzo et al.

(10) Patent No.: US 12,025,309 B2
(45) Date of Patent: Jul. 2, 2024

(54) METHOD FOR OPERATING A PREMIX GAS BURNER, A PREMIX GAS BURNER AND A BOILER

(71) Applicant: BDR THERMEA GROUP B.V., Apeldoorn (NL)

(72) Inventors: Marco Dal Gazzo, Apeldoorn (NL); Sebastiano Temperato, Apeldoorn (NL)

(73) Assignee: BDR THERMEA GROUP B.V., Apeldoorn (NL)

( * ) Notice: Subject to any disclaimer, the term of this patent is extended or adjusted under 35 U.S.C. 154(b) by 380 days.

(21) Appl. No.: 17/442,580

(22) PCT Filed: Mar. 25, 2020

(86) PCT No.: PCT/NL2020/050201
§ 371 (c)(1),
(2) Date: Sep. 23, 2021

(87) PCT Pub. No.: WO2020/197391
PCT Pub. Date: Oct. 1, 2020

(65) Prior Publication Data
US 2022/0120440 A1   Apr. 21, 2022

(30) Foreign Application Priority Data

Mar. 28, 2019   (NL) ..................... 2022826

(51) Int. Cl.
*F23N 1/02*    (2006.01)
*F23D 14/02*   (2006.01)
*G06F 30/20*   (2020.01)

(52) U.S. Cl.
CPC ............. *F23N 1/022* (2013.01); *F23D 14/02* (2013.01); *G06F 30/20* (2020.01);
(Continued)

(58) Field of Classification Search
CPC .......... F23D 14/02; F23D 14/82; F23N 1/022; G06F 30/20
See application file for complete search history.

(56) References Cited

U.S. PATENT DOCUMENTS 6,213,758 B1 *  4/2001  Tesar ................... F23N 1/022
                                                      431/89
11,668,493 B2 *  6/2023  Dal Gazzo ............ F23D 14/62
                                                      122/14.2
(Continued)

FOREIGN PATENT DOCUMENTS

AT          505064       10/2008
DE          1645860      12/1970
(Continued)

OTHER PUBLICATIONS

WIPO, International Search Report for PCT/NL2020/050201, dated May 27, 2020.

*Primary Examiner* — Alfred Basichas
(74) *Attorney, Agent, or Firm* — Hodgson Russ LLP (57) ABSTRACT

A method for operating a premix gas burner wherein an air flow rate and/or a fuel gas flow rate are controlled so as to generate heat with the premix burner in accordance with a heat demand related value. The fuel gas comprises hydrogen and the method further provides a desired air excess factor relation of the air/fuel gas mixture which defines the relation between a desired air excess factor and an input variable like the heat demand related value, an air flow rate related value, or a fuel gas flow rate related value. The desired air excess factor is not a constant factor but varies for different input variable values. The fuel gas flow rate and/or the air flow rate are controlled such that an actual air excess factor converges towards the desired air excess factor while meeting the heat demand.

10 Claims, 3 Drawing Sheets

(52) U.S. Cl.
CPC ...... *F23N 2225/04* (2020.01); *F23N 2225/16* (2020.01); *F23N 2231/28* (2020.01); *F23N 2233/08* (2020.01)

(56) References Cited

U.S. PATENT DOCUMENTS

| | | | | |
|---|---|---|---|---|
| 2006/0105279 | A1* | 5/2006 | Munsterhuis | F23N 5/123 |
| | | | | 431/18 |
| 2017/0254536 | A1* | 9/2017 | Super | F23N 1/022 |
| 2017/0370577 | A1* | 12/2017 | Senkyr | F23N 5/003 |
| 2019/0162408 | A1* | 5/2019 | Eadie | F23M 20/005 |
| 2021/0255063 | A1* | 8/2021 | Geiger | F23N 5/02 |

FOREIGN PATENT DOCUMENTS

| | | |
|---|---|---|
| EP | 2362145 | 8/2011 |
| WO | 2004015333 | 2/2004 |
| WO | 2006000366 | 1/2006 |

* cited by examiner

METHOD FOR OPERATING A PREMIX GAS BURNER, A PREMIX GAS BURNER AND A BOILER

FIELD

The invention relates to a method for operating a premix gas burner, a premix gas burner and a boiler comprising the premix burner device.

BACKGROUND

WO 2006/000366 is directed to providing a simplified method for fuel-independent regulation of a firing device and to reliably guarantee a supply of fuel independent of gas-type, even with rapid load changes and during the start phase, without any time delays and discloses a method for operating a premix gas burner. The known method comprises:
  providing the premix gas burner having a burner deck;
  acquiring a heat demand related value;
  supplying a flow of fuel gas and supplying a flow of air to form a mixture;
  supplying the mixture to the premix gas burner to burn the mixture;
  controlling in dependence of the acquired heat demand related value at least one of:
    an air flow rate, and
    a fuel gas flow rate, so as to generate heat with the premix burner in accordance with the acquired heat demand related value.

WO'366 also discloses a premix gas burner. The known device comprises:
  a premix gas burner having a burner deck;
  a supply channel for supplying a combustible mixture to the premix gas burner;
  a fan for supplying air or the combustible mixture to the supply channel;
  a fuel gas supply including a fuel gas control valve for supplying a fuel gas to the supply channel;
  a mixing area for mixing the air and the fuel gas so as to form the combustible mixture; and
  an electronic controller for controlling the rotational speed of the fan and the fuel gas control valve.

According to WO'366 the burner is operated by measuring the temperature of the burner deck of the premix burner, by comparing the actual burner deck temperature with a desired temperature and by controlling the amount of fuel that is supplied to the burner. The desired temperature is a function of the burner load ($Q$). The burner load is determined by measuring a volume flow or mass flow of the air which is supplied to the burner. When operating the premix burner the air excess factor is kept constant. The air excess factor $\lambda$ is defined as the ratio of the actual air to fuel ratio of the mixture relative to the stoichiometric air to fuel ratio.

An air excess factor smaller than 1 means that there is not enough air for all of the fuel gas to combust, which means fuel gas is wasted and exits via a flue channel uncombusted or partially combusted as poisonous carbon monoxide (CO) emissions. This decreases the efficiency of the central heating boiler. Also the flame temperature may become too high, resulting in high nitrogen oxides ($NO_x$) emissions. A high air excess factor means that there is too much air, which air is heated during the combustion, resulting in hot air and uncondensed water vapor due a lower dew point, leaving via the flue channel. This also decreases the efficiency of the boiler. According to WO'366, the air excess factor is kept constant over the entire range of operating conditions, i.e. of the entire range of loads of the burner.

EP 2 362 145 A2 is directed to providing a method for operating a burner with air-excess factor-controlled combustion of a fuel and for air-excess factor controlled modulation of a burner output $Q$, which represents a control of the air excess factor over a wide output modulation range and does not require a plurality of individually corrected factors that need to be adjusted. In order to achieve this goal, EP'145 discloses an operating point calibration within the available output modulation range and air excess factor regulation for operating a burner with air-controlled combustion of a fuel and for air-regulated modulation of a burner output $Q$, by varying a first parameter of a parameter set, which is formed from combustion air amount and fuel amount, when a second parameter of the set is held constant, and adjusting the first parameter to a value in which an ionization signal has its maximum. The second parameter is then varied while the first parameter is held constant, and the second parameter is adjusted to a value in which the ionization signal amounts to a fraction of the maximum, wherein the fraction is the product of the ionization signal maximum and a predetermined factor that is smaller than 1.

SUMMARY OF THE INVENTION

Gas burners are usually controlled to respond to the demand of heat, or burner load. They are configured such that a heat output matches a required burner load. Each gas burner has a maximum heat output, i.e. power, and a corresponding working range of burner loads.

An amount of potential energy put into the boiler per unit of time is proportional to a flow rate of a fuel gas, wherein the flow rate is defined as a mass or volume of the fuel gas which goes to the gas burner per unit of time. The flow rate has a positive relation with the heat output of the central heating boiler, and with a constant efficiency across its working range, the heat output is proportional to the flow rate. This efficiency however is influenced by the ratio of the fuel gas and air and by a temperature of the exhaust gases.

Furthermore, a velocity of the mixture flowing out of the burner deck can only be varied within certain limits. These limits are determined amongst others by the flame speed which is defined as the measured rate of expansion of the flame front in a combustion reaction. When the mixture velocity becomes smaller than the flame speed, the flame will traverse in the upstream direction, which is toward the burner deck and even across the burner deck into the burner causing a so-called flashback. Flashback can be triggered e.g. by a change in a ratio of the gaseous fuel to the air in the mixture, by a change in composition of the gaseous fuel, or by a change in pressure in the combustion chamber, e.g. caused by a pressure drop at the outlet of a flue channel caused by wind or other natural causes. Flashback may also be triggered by high local temperatures of the burner surface.

When the mixture velocity becomes too high and rises above a so-called blow-off speed, blow-off may occur which means that the flame is blown-off the burner deck, with the consequence that the flame extinguishes or suffers incomplete combustion. The mixture velocity needs to be controlled between the flame speed and blow off speed.

Conventional gas burners, e.g. of a central heating boiler, are optimized to combust natural gas, which is a fuel gas primarily comprising methane ($CH_4$). Due to the global warming discussions, research to replace natural gas as fuel for a gas burner is ongoing. One such solution is to use hydrogen ($H_2$) as a fuel gas. However, the use of hydrogen as a fuel gas results in new challenges. Although WO'366 states its method achieves effective regulation independently of the gas type, the method of WO'366 is not optimal for gas burners which use a fuel gas comprising hydrogen. The main drawback is that the method of WO'366 does not account for flashbacks which more easily occur when the fuel gas comprises hydrogen. Flashbacks occur more easily because the laminar flame speed (in the following flame speed) of hydrogen air mixture is around seven times higher than the flame speed for methane air mixture.

Therefore, an object of the invention is to provide a method for operating a premix gas burner, for example for a boiler for heating water for central heating and/or for tap water, wherein the fuel gas comprises hydrogen and wherein the air flow of the gas burner can be modulated over a large range with a reduced risk of flashback and/or too high or too low burner deck temperatures.

To that end, the invention provides method according to claim 1. More particularly, the invention provides a method comprising:
providing the premix gas burner having a burner housing with a burner deck;
acquiring a heat demand related value;
supplying a flow of fuel gas and supplying a flow of air to form a mixture;
supplying the mixture to the premix gas burner to burn the mixture;
controlling in dependence of the acquired heat demand related value at least one of:
an air flow rate, and
a fuel gas flow rate,
so as to generate heat with the premix burner in accordance with the acquired heat demand related value.

According to the invention, the method is characterized in that:
the fuel gas comprises hydrogen; and
in that the method further comprises:
providing a desired air excess factor relation of the mixture which defines the relation between a desired air excess factor and a chosen input variable, wherein the input variable is one of the following parameters:
the heat demand related value;
the air flow rate related value indicative for a flow rate of the flow of air; or
the fuel gas flow rate related value indicative of the actual fuel gas flow rate,
wherein the desired air excess factor is not a constant factor but varies for different input variable values,
wherein the desired air excess factor is defined as the ratio of the desired air to fuel gas ratio of the mixture relative to the stoichiometric air to fuel gas ratio;
determining an actual value of the input variable;
determining an actual air excess factor, wherein the actual air excess factor is defined as the ratio of the actual air to fuel gas ratio of the mixture relative to the stoichiometric air to fuel gas ratio;
controlling the fuel gas flow rate and/or the air flow rate such that:
the actual air excess factor converges towards the desired air excess factor belonging to the actual value of the input variable; and that
the heat generated with the premix burner remains in accordance with the acquired heat demand related value.

Additionally, the invention provides a premix gas burner, which comprises:
a burner housing with a burner deck;
a supply channel for supplying a combustible mixture to the premix gas burner;
a fan for supplying air or the combustible mixture to the supply channel;
a fuel gas supply including a fuel gas control valve for supplying a fuel gas to the supply channel;
a mixing area for mixing the air and the fuel gas so as to form the combustible mixture; and
an electronic controller for controlling the rotational speed of the fan and the fuel gas control valve;

The premix burner according to the invention is characterized in that the electronic controller comprises a memory in which a desired air excess factor relation of the mixture is stored which defines the relation between a desired air excess factor and a chosen input variable, wherein the input variable is one of the following parameters:
the heat demand related value;
the air flow rate related value indicative for a flow rate of the flow of air; or
the fuel gas flow rate related value indicative of the actual fuel gas flow rate,
wherein the desired air excess factor is not a constant factor but varies for different values of the input variable,
wherein the desired air excess factor is defined as the ratio of the desired air to fuel gas ratio of the mixture relative to the stoichiometric air to fuel gas ratio;
wherein the electronic controller is configured to:
determine an actual value of the input variable;
determine an actual air excess factor, wherein the actual air excess factor is defined as the ratio of the actual air to fuel gas ratio of the mixture relative to the stoichiometric air to fuel gas ratio;
control the fuel gas flow rate and/or the air flow rate such that:
the actual air excess factor converges towards the desired air excess factor belonging to the actual value of the input variable; and that
the heat generated with the premix burner remains in accordance with the acquired heat demand related value.

In an embodiment of the method according to the invention, the "providing a desired air excess factor relation ($\lambda_d(I)$) of the mixture which defines the relation between a desired air excess factor and a chosen input variable (I)" may be realized by storing said desired air excess factor in a memory of an electronic controller. In an embodiment of the method, the "controlling the fuel gas flow rate (FG) and/or the air flow rate (F) such that: . . . " may be effected by means of the electronic controller.

The invention further provides a boiler for heating water, e.g. for central heating and/or for tap water heating. More particular, the boiler comprises the premix gas burner according to the invention, and a heat exchanger having a combustion chamber. The burner deck of the premix gas burner is positioned in the combustion chamber.

The invention is based upon the realization that fuel gasses comprising hydrogen have a higher flame speed than the flame speed for methane and, consequently also a higher blow off speed. It is therefore possible to increase the air excess factor, without immediately risking a blow off. In accordance with the invention, it is not necessary for reducing flashback to increase the air excess factor for all air flow rates, i.e. burner loads. Thus, the efficiency is improved relative to the solution of WO'366 in which the air excess factor is kept constant for all air flow rates. At higher loads, i.e. higher air flow rates, the chance of flashback is smaller due to the higher mixture velocity. So, at higher air flow rates, the air excess factor may be smaller, so that less air relative to the amount of fuel gas is needed and less heat will leave the boiler via the flue. At lower air flow rates, the air excess factor is increased to reduce the risk of flashback. Such an increase of air excess factor at lower loads is possible, because with hydrogen, the risk of blow-off is smaller due to the higher flame speed than natural gas. Consequently, by controlling the fuel gas flow rate and/or the air flow rate such that the heat generated with the premix burner remains in accordance with the acquired heat demand related value and that the actual air excess factor converges towards the desired air excess factor belonging to the actual value of the input variable, i.e. the heat demand related value, the airflow related value or the fuel gas flow rate related value, the chance of the occurrence of flashback is reduced while at the same time the efficiency of the premix burner is high.

The present invention and further embodiments thereof will be further elucidated with reference to examples shown in the figures. The embodiments may be combined or may be applied separately from each other

DETAILED DESCRIPTION OF THE FIGURES

In this application similar or corresponding features are denoted by similar or corresponding reference signs. The description of the various embodiments is not limited to the example shown in the figures and the reference numbers used in the detailed description and the claims are not intended to limit the description of the embodiments, but are included to elucidate the embodiments by referring to the example shown in the figures.

In general, the invention relates to a method for operating a premix gas burner 12. The method comprises:
  providing the premix gas burner 12 having a burner housing with a burner deck 24;
  acquiring a heat demand related value $\dot{Q}$;
  supplying a flow of fuel gas and supplying a flow of air to form a mixture;
  supplying the mixture to the premix gas burner 12 to burn the mixture;
  controlling in dependence of the acquired heat demand related value $\dot{Q}$ at least one of:
    an air flow rate, and
    a fuel gas flow rate,
  so as to generate heat with the premix burner in accordance with the acquired heat demand related value $\dot{Q}$.

The method is characterized in that the fuel gas comprises hydrogen ($H_2$) and in that the method further comprises:
  providing a desired air excess factor relation $\lambda_d(I)$ of the mixture which defines the relation between a desired air excess factor and a chosen input variable I, wherein the input variable I is one of the following parameters:
    the heat demand related value $\dot{Q}$;
    the air flow rate related value F indicative for a flow rate of the flow of air; or
    the fuel gas flow rate related value FG indicative of the actual fuel gas flow rate,
      wherein the desired air excess factor $\lambda_d(I)$ is not a constant factor but varies for different input variable values I,
      wherein the desired air excess factor $\lambda_d(I)$ is defined as the ratio of the desired air to fuel gas ratio of the mixture relative to the stoichiometric air to fuel gas ratio;
  determining an actual value $I_a$ of the input variable I;
  determining an actual air excess factor $\lambda$, wherein the actual air excess factor $\lambda_a$ is defined as the ratio of the actual air to fuel gas ratio of the mixture relative to the stoichiometric air to fuel gas ratio;
  controlling the fuel gas flow rate FG and/or the air flow rate F such that:
    the actual air excess factor $\lambda_a$ converges towards the desired air excess factor $\lambda_d(I)$ belonging to the actual value $I_a$ of the input variable; and that
    the heat generated with the premix burner remains in accordance with the acquired heat demand related value $\dot{Q}$.

Figure 1:
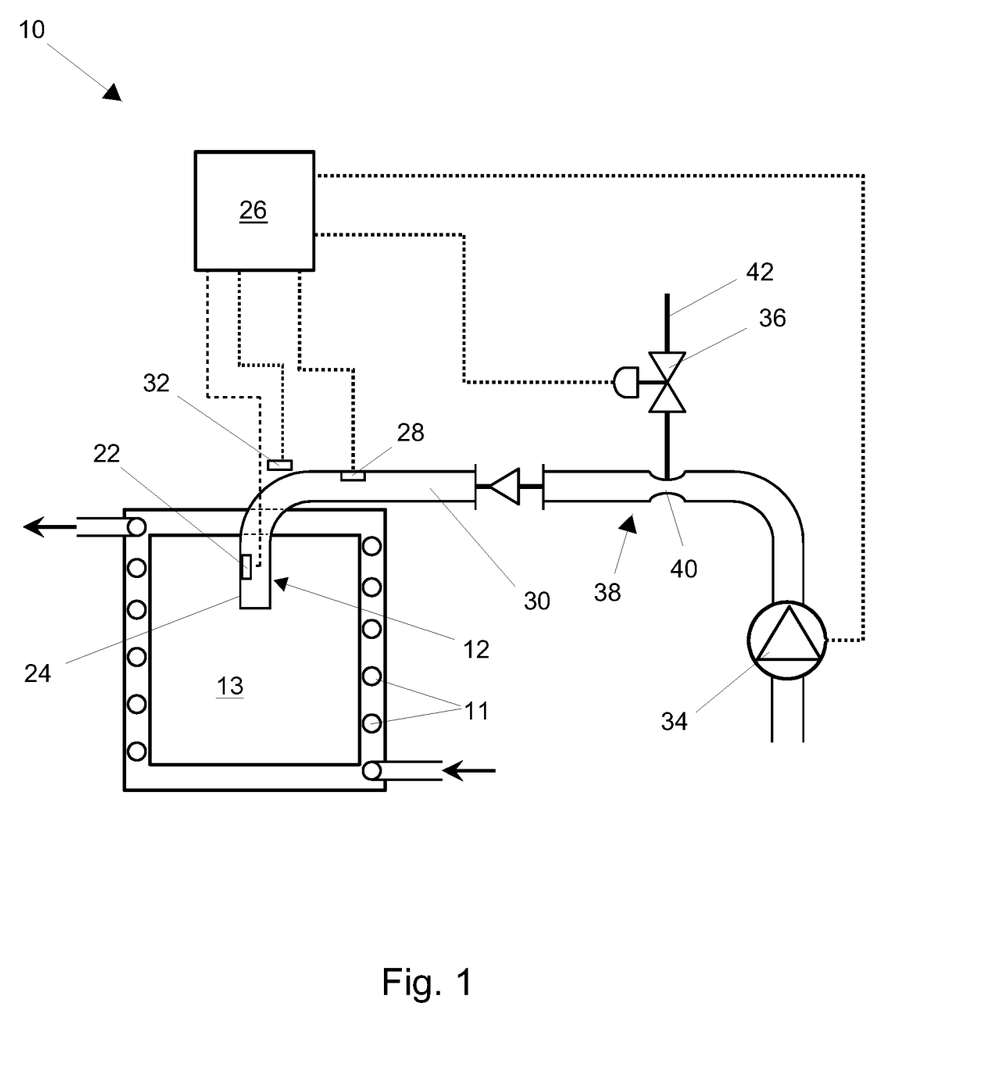
FIG. 1 shows schematically an example of a boiler according to the invention.

The invention also provides a premix gas burner comprising:
  a burner housing with a burner deck 24;
  a supply channel 30 for supplying a combustible mixture to the premix gas burner 12;
  a fan 34 for supplying air or the combustible mixture to the supply channel 30;
  a fuel gas supply 42 including a fuel gas control valve 36 for supplying a fuel gas to the supply channel 30;
  a mixing area 38 for mixing the air and the fuel gas so as to form the combustible mixture; and
  an electronic controller 26 for controlling the rotational speed of the fan 34 and the fuel gas control valve 36.

The premix gas burner is characterized in that the electronic controller 26 comprises a memory in which a desired air excess factor relation $\lambda_d(I)$ of the mixture is stored which defines the relation between a desired air excess factor and a chosen input variable I, wherein the input variable I is one of the following parameters:
  the heat demand related value $\dot{Q}$;
  the air flow rate related value F indicative for a flow rate of the flow of air; or
  the fuel gas flow rate related value FG indicative of the actual fuel gas flow rate,
    wherein the desired air excess factor $\lambda_d(I)$ is not a constant factor but varies for different values of the input variable I,
    wherein the desired air excess factor $\lambda_d(I)$ is defined as the ratio of the desired air to fuel gas ratio of the mixture relative to the stoichiometric air to fuel gas ratio;

wherein the electronic controller 26 is configured to:
determine an actual value $I_a$ of the input variable I;
determine an actual air excess factor $\lambda_a$, wherein the actual air excess factor $\lambda_a$ is defined as the ratio of the actual air to fuel gas ratio of the mixture relative to the stoichiometric air to fuel gas ratio;
control the fuel gas flow rate FG and/or the air flow rate F such that:
the actual air excess factor $\lambda_a$ converges towards the desired air excess factor $\lambda_d(I)$ belonging to the actual value $I_a$ of the input variable I; and that
the heat generated with the premix burner 12 remains in accordance with the acquired heat demand related value $Q$.

The mixing area 38 may comprise a mixing device 40. The mixing device 40 may be embodied as a venturi with a throat as schematically indicated in FIG. 1. The mixing device 40 may also be embodied in other ways. The mixing area 38 may be formed by (a part of) the supply channel 30. For example, a part of the supply channel 30 which is downstream of the point where the fuel gas supply 42 is connected to the supply channel 30. The mixing area may also include the fan 34 when the fuel gas supply 42 is connected upstream from the fan 34 to the supply channel 30.

The invention further provides a boiler 10 for heating water, e.g. for central heating and/or for tap water heating. As is visible in the schematic example shown in FIG. 1 the boiler 10 comprises the premix gas burner 12 according to the invention, and a heat exchanger 11 having a combustion chamber 13. The burner deck 24 of the premix gas burner 12 is positioned in the combustion chamber 13.

The effects and advantages of the method, the premix gas burner and the boiler 10 have been described in the summary section and these effects and advantages are inserted here by reference.

In a first embodiment of both the method and the premix gas burner 12, the air flow rate F is controlled in dependence of the heat demand related value $Q$. The fuel gas flow rate FG is controlled in dependence of the actual air flow rate related value $F_a$. The chosen input variable I of desired air excess factor relation $\lambda_d(I)$ of the mixture is the air flow rate related value F indicative for a flow rate of the flow of air. In this embodiment, in which the fuel gas flow rate FG follows the air flow rate related value $F_a$ which is advantageous because the fuel gas flow rate FG can be controlled very rapidly by means of the controlling the fuel gas control valve 36. Consequently, the desired air excess factor relation $\lambda_d(I)$ of the mixture can be achieved very quickly when the air flow rate related value $F_a$ varies, e.g. as a consequence of a increased heat demand related value $Q$.

In a second embodiment of both the method and the premix gas burner 12, which second embodiment is an alternative to the first embodiment, the fuel gas flow rate FG is controlled in dependence of the heat demand related value $Q$. The air flow rate F is controlled in dependence of the actual fuel gas flow rate related value $FG_a$. The chosen input variable I of desired air excess factor relation $\lambda_d(I)$ of the mixture is the actual fuel gas flow rate related value $FG_a$ indicative for a flow rate of the fuel gas. In this second embodiment, for example the rotational speed of the fan is varied in dependence of the actual fuel gas flow rate related value. Also this type of control is a feasible solution.

In a third embodiment of both the method and the premix gas burner 12, which third embodiment is an alternative to the first and the second embodiment, both the fuel gas flow rate FG as well as the air flow rate F are directly controlled in dependence of the heat demand related value $Q$, wherein the chosen input variable I of desired air excess factor relation $\lambda_d(I)$ of the mixture is the heat demand related value $Q$. It will be clear that in this embodiment, the control is also very quick because both the fuel gas flow rate FG as well as the air flow rate F are controlled simultaneously.

In an embodiment of the method, the fuel gas may in addition to hydrogen ($H_2$) also comprise methane. In the shift from natural gas to a hydrogen dominated society, there will probable an intermediate period in which a mixture of natural gas and hydrogen is supplied in the gas supply network. The method according to the invention also relates to burning a mixture of natural gas, which mainly comprises methane, and hydrogen in a premix burner 12. The premix burner 12 according to the invention is also well suited for burning mixtures of methane and hydrogen.

Figure 2:
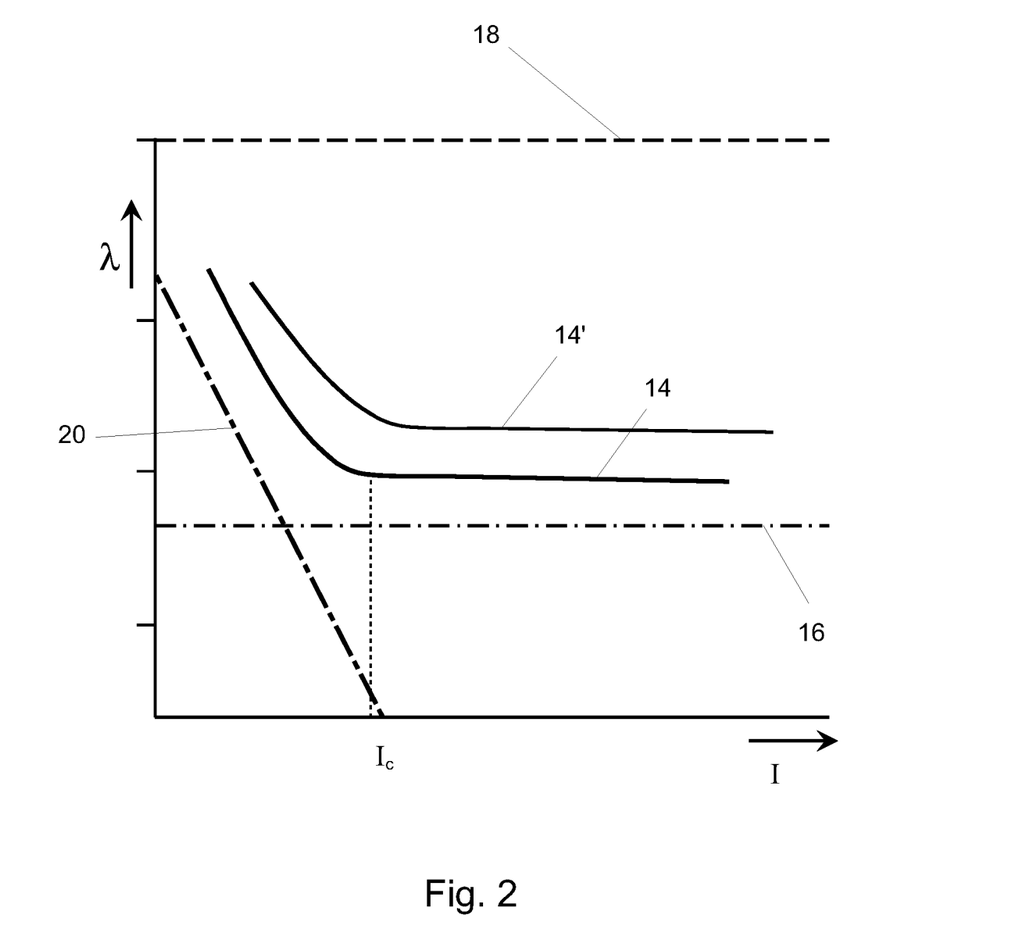
FIG. 2 shows an air flow/air excess factor-diagram in which an example of a working curve according to the invention is shown.

In a preferred embodiment, the desired air excess factor relation $\lambda_d(I)$ of the mixture defines a working curve 14 in an input variable/air excess factor-diagram (an $I/\lambda_d(I)$-diagram) in which the input variable I is defined on the horizontal axis and the desired air excess factor $\lambda_d(I)$ is defined on the vertical axis. An example of such a diagram is shown in FIG. 2. The working curve 14 extends in a work area which, along a working range of the input variable I, is bounded at an underside by an emission limit line 16, at an upper side by a blow off limit line 18, and at a left-hand side by a flashback limit line 20, which flashback limit line 20 strictly increases when the value of the input variable I decreases.

Below the emission limit line 16 there is not enough air for the hydrogen comprising combustible mixture to fully combust, and/or a flame temperature may become too high, resulting in too high nitrogen oxides $NO_x$ emissions. The working curve 14 should therefore be kept above the emission limit line 16, preferably at a safety margin from the emission limit line 16. Above the blow off limit line 18 the mixture velocity is so high that the flame is not stable anymore and a blow-off occurs. Left of the flashback limit line 20 the mixture velocity is that low that it is smaller than the flame speed or the length of the flames is so short that the temperature of the upstream side of the burner deck will exceed the auto-ignition temperature of the mixture, both meaning a flashback will occur. In accordance with this embodiment, the working curve 14 extends in the area bounded by these limit lines 16, 18, 20. Preferably, the air excess factor $\lambda$ is kept as low as possible so as to achieve the highest efficiency with acceptable nitrogen oxides $NO_x$ emissions.

In a further elaboration of this embodiment, the emission limit line 16 comprises a constant emission limit line air excess factor $\lambda_{ELL}$. The emission limit line air excess factor $\lambda_{ELL}$ may be between 1 and 1.5, preferably around 1.2.

As explained, an air excess factor of 1 means that the mixture comprising hydrogen and air is a stoichiometric mixture, which means that the mixture comprises exactly enough oxygen molecules to bond with every fuel molecule. Because these molecules can freely move, it is hard for the last fuel molecule to find the last oxygen molecule. It is therefore advantageous to have a small air excess factor $\lambda$, so that each fuel molecule, even the last one, is able to readily bond with an available oxygen molecule. It turns out that it is advantageous for the efficiency of the combustion to have an air excess factor between 1 and 1.5, preferably around 1.2. It is therefore best to choose a constant emission limit line air excess factor $\lambda_{ELL}$ with this value. The working curve 14 should be kept above this value.

In a further elaboration of the first embodiment, the blow off limit line 18 is determined by tests in which for a number of air flow rate related values F the flow rate FG of the fuel gas (the test gas can be chosen in accordance with the desired gas quality) is varied until a fuel gas flow rate value is reached at which the premix gas burner 12 starts to blow off and by calculating a blow off limit line air excess factor $\lambda_{BOLL}$ belonging to that air flow rate related value F and fuel flow rate value FG. The number of blow off limit line air excess factors $\lambda_{BOLL}$ thus determined define points of the blow off limit line 18.

In a further elaboration of the second embodiment, the blow off limit line 18 is determined by tests in which for a number of gas flow rate related values FG the flow rate of the air is varied until a air flow rate value F is reached at which the premix gas burner 12 starts to blow off and by calculating a blow off limit line air excess factor $\lambda_{BOLL}$ belonging to that air flow rate related value F and fuel flow rate value FG. The number of blow off limit line air excess factors $\lambda_{BOLL}$ thus determined define points of the blow off limit line 18.

A fuel gas comprising hydrogen is more reactive for combustion than e.g. natural gas. This means that the fuel molecules are more readily to react with oxygen molecules. As a result, the combustion of these fuel molecules can be performed with a lower concentration compared with the fuel molecules of natural gas. In other words, with a higher air excess factor $\lambda$ for a fuel gas comprising hydrogen the combustion can still take place without the occurrence of a blow-off. The values of the air excess factor $\lambda_{BOLL}$ above which the premix gas burner 12 starts to blow off are dependent on the characteristics of the premix gas burner 12, such as its size, shape, maximum load etc. and can be determined by tests. The working curve 14 should be kept below these values.

In an embodiment, of which an example is shown in FIG. 2 the desired air excess factor $\lambda_d(I)$ of the working curve 14 is substantially constant (meaning with a tolerance of up to $\pm 0.05\lambda$) for values of the input variable I which are higher than a cut-off input variable value $I_c$. For input variable values I which are lower than the cut-off input variable value $I_c$ the desired air excess factor $\lambda_d(I)$ of the working curve 14 strictly increases when the input variable value I decreases. The desired air excess factor $\lambda_d(I)$ of the working curve 14 is between 1.0 and 1.6, preferably between 1.2 and 1.4, more preferably around 1.3 for input variable values I which are higher than the cut-off input variable value $I_c$.

A small air excess factor $\lambda$ is usually preferable, because that is the most efficient. According to this embodiment, a small desired air excess factor $\lambda_d(I)$ is chosen for input variable values I which are higher than the cut-off input variable value $I_c$. At input variable values I higher than the cut-off input variable value $I_c$, the lower limit of the area in which the working curve 14 must extend is not formed by the flashback limit line 20 but by the emission limit line 16. However, for input variable values I lower than the cut-off input variable value $I_c$, the lower limit of the area may well be formed by the flashback limit line 20 which has a downwardly directed slope when viewed from low input variable values I to higher input variable values I. According to this embodiment, for input variable values I which are lower than the cut-off input variable value $I_c$ the desired air excess factor $\lambda_d(I)$ of the working curve 14 strictly increases when the input variable value I decreases. This means that for every input variable value $I_2$ which is smaller than input variable value $I_1$, the corresponding desired air excess factor $\lambda_d(I)$ on the working curve 14 is higher. Or in a formula, for every $I<I_c$, if $I_1>I_2$, then $\lambda(I_1)<\lambda(I_2)$. The actual cut-off input variable value $I_c$ will, amongst others, depend on the configuration of the premix gas burner 12 and the maximum air flow rate F, i.e. the maximum heat, the premix burner 12 can deliver.

Figure 3:
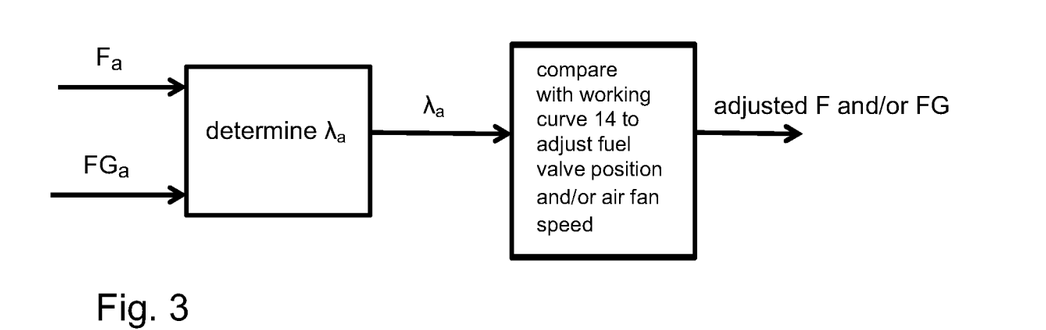
FIG. 3 shows a schematic representation of the control of the gas burner according to an example of the invention.

In an embodiment, of which a schematic representation is shown in FIG. 3, the method includes acquiring an actual air flow rate related value $F_a$ indicative of the actual flow rate of the air, wherein the acquiring includes at least one of:
  measuring the actual air mass flow rate in the supply of air;
  measuring the actual air volume flow rate in the supply of air; and
  determining the rotational speed or rotations per time unit of the fan;

Additionally, this embodiment of the method includes acquiring an actual fuel gas flow rate related value $FG_a$ indicative of the actual fuel gas flow rate, wherein this acquiring includes at least one:
  measuring the actual fuel gas mass flow rate in the supply of fuel gas;
  measuring the actual fuel gas volume flow rate in the supply of fuel gas.

Further, in this embodiment of the method the determining of the actual air excess factor $\lambda_a$ is effected by:
  calculating the actual air excess factor $\lambda_a$ from the actual flow rate $FG_a$ of the fuel gas, the actual air flow rate related value $F_a$ and the stoichiometric air to fuel ratio.

In an embodiment of the premix gas burner 12, the calculating may be performed by a controller 26. The controller 26 may have the stoichiometric air to fuel ratio stored in memory.

Figure 4:
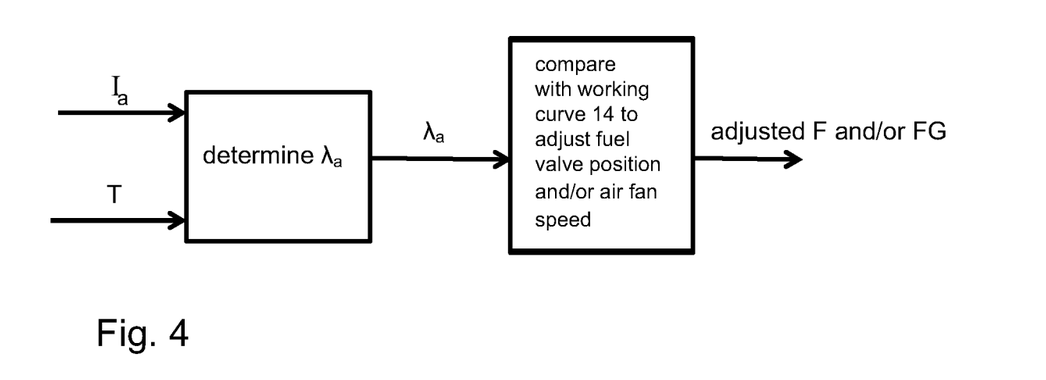
FIG. 4 shows a schematic representation of the control of the gas burner according to another example of the invention.

In an alternative embodiment, of which a schematic representation is shown in FIG. 4, the determining of the actual air excess factor $\lambda_a$ may be effected by measuring a temperature T of the burner deck 24 and by acquiring a matching air excess factor $\lambda_a$ from an air excess factor map, curve or formula stored in a memory. The air excess factor map, curve or formula defines the air excess factor $\lambda_a$ in dependence of both the burner deck temperature T and the actual value of the input variable $I_a$. Again, the acquiring of the matching air excess factor $\lambda_a$ may be performed by a controller 26. The controller 26 may comprise the memory in which the air excess factor map, curve or formula is stored.

In an embodiment of the method and of the premix gas burner, the premix gas burner is provided with a temperature sensor 22 capable of detecting a signal which is indicative of a burner deck 24 temperature T. In this embodiment, the existing working curve 14 is adapted in response to a detection of a too low or too high burner deck temperature T at a given input variable value I so as to obtain an adapted working curve 14'. The electronic controller 26 of the embodiment of the premix gas burner 12 is configured to perform this adaptation.

A too high temperature T of the burner deck 24 at given input variable value I is an indication of a too high flame temperature which may result in the emission of unwanted nitrogen oxides $NO_x$ or risk of flashback. A too low burner deck temperature T at given input variable value I is an indication for an excess of air and thus an inefficient combustion. When for some reason, the circumstances in the premix gas burner 12 are such that the burner deck temperature T becomes too high or too low at given input variable value I, the method of this embodiment will detect the exceeding temperature T and adapt the working curve 14 so that the chance of a too high or too low temperature in future is reduced.

In an embodiment of the method and the premix gas burner 12 in which the working curve 14 is adapted, the adapting the existing working curve 14 in response to a detection of a too low or too high burner deck temperature T at given input variable value I comprises at least one of:

shifting the working curve 14 in the input variable/air excess factor-diagram to the left with respect to the input variable value I when the burner deck temperature is too low in relation to the input variable value F, such that the new working curve 14' as a function of the input variable value I relates to the former working curve 14 in that: $\lambda_{new}(I)=\lambda(I+\Delta I)$, wherein $\Delta I$ is the shift in input variable value I;

shifting the working curve 14 in the input variable/air excess factor-diagram downwardly with respect to the air excess factor $\lambda$ when the burner deck temperature is too low in relation to the input variable value I, such that the new working curve 14' as a function of the input variable value I relates to the former working curve 14 in that: $\lambda_{new}(I)=\lambda(I)-\Delta\lambda$, wherein $\Delta\lambda$ is the shift in air excess factor $\lambda$;

making the slope of the working curve 14 less steep for input variable values I which are lower than the cut-off input variable value $I_c$ when the burner deck temperature is too low in relation to the input variable value I; and shifting the cut-off input variable value $I_c$ in the input variable/air excess factor-diagram to the left when the burner deck temperature is too low in relation to the input variable value I, such that the new cut-off input variable value $I_c'$ relates to the former cut-off input variable value $I_c$ in that: $I_c'<I_c$;

shifting the working curve 14 in the input variable/air excess factor-diagram to the right with respect to the input variable value I when the burner deck temperature is too high in relation to the input variable value I, such that the new working curve 14' as a function of the input variable value I relates to the former working curve 14 in that: $\lambda_{new}(I)=\lambda(I-\Delta I)$, wherein $\Delta I$ is the shift in input variable value I;

shifting the working curve 14 in the input variable/air excess factor-diagram upwardly with respect to the air excess factor $\lambda$ when the burner deck temperature is too high in relation to the input variable value I, such that the new working curve 14' as a function of the input variable value I relates to the former working curve 14 in that: $\lambda_{new}(I)=\lambda(I)+\Delta\lambda$, wherein $\Delta\lambda$ is the shift in air excess factor $\lambda$;

making the slope of the working curve 14 steeper for input variable values I which are lower than the cut-off input variable value $I_c$ when the burner deck temperature is too high in relation to the input variable value I; and shifting the cut-off input variable value $I_c$ in the input variable/air excess factor-diagram to the right when the burner deck temperature is too high in relation to the input variable value I, such that the new cut-off input variable value $I_c'$ relates to the former cut-off input variable value $I_c$ in that: $I_c'>I_c$.

The shifting of the working curve 14 with respect to the input variable value I may be executed such that the new working curve 14 as a function of the input variable value I relates to the former working curve 14 in that: $\lambda_{new}(I)=\lambda(I-\Delta I)$ for a shift to the right, and in that: $\lambda_{new}(I)=\lambda(I+\Delta I)$ for a shift to the left, wherein $\Delta I$ is the shift in the input variable value I. The shifting of the working curve 14 with respect to the air excess factor $\lambda$ may be executed such that the new working curve 14 as a function of the input variable value I relates to the former working curve 14 in that: $\lambda_{new}(I)=\lambda(I)+\Delta\lambda$ for an upward shift, and in that: $\lambda_{new}(F)=\lambda(F)-\Delta\lambda$ for a downward shift, wherein $\Delta\lambda$ is the shift in air excess factor $\lambda$. The shifting of the cut-off input variable value $I_c$ may be executed such that the new cut-off input variable value $I_c'$ relates to the former cut-off input variable value $I_c$ in that: $I_c'>I_c$ for a shift to the right, and in that: $I_c'<I_c$ for a shift to the left.

As explained above, one of the drawbacks of using a fuel gas comprising hydrogen in a premix gas burner 12 is the possibility of the flame temperature become too high. The use of the working curve 14 is aimed at avoiding this drawback in an optimal way. An existing working curve 14 may, e.g. due to a change in external circumstances, become ill-fitted for the new circumstances, meaning that the burner deck temperature T may become too high at a given input variable value I, which is indicative of a too high flame temperature, or too low, which is indicative of an inefficient combustion. Detecting these too high and/or too low temperatures T and adapting the existing working curve 14 will additionally optimize the working curve 14. According to this embodiment, the adaptation of the working curve in response to the detection of a too high or too low burner deck temperature T at given air flow rate related value F involves moving the working curve 14 away from or towards the flashback limit line 20 and/or the emission limit line 16, making the occurrence of a too high or too low burner deck temperature T even less likely. Of course, combinations of these adaptations may be used as well.

In an embodiment of the method, the premix gas burner 12 comprises a sensor 22, 28, 32 capable of detecting a signal which is indicative of a flashback. The method further comprises adapting the existing working curve 14 in response to a detection of a flashback so as to obtain an adapted working curve 14'.

In an embodiment of the premix gas burner, the premix gas burner comprises a sensor 22, 28, 32 capable of detecting a signal which is indicative of a flashback. This embodiment of the premix gas burner has an electronic controller 26 which is configured to adapt the existing working curve 14 in response to a detection of a flashback so as to obtain an adapted working curve 14'.

When for some reason, the circumstances in the premix gas burner 12 are such that a flashback occurs, the method of this embodiment will detect the flashback and adapt the working curve 14 so that the chance of a flashback in the future is reduced.

In a further elaboration of the embodiment with the flashback detection, the adapting the existing working curve 14 in response to a detection of a flashback comprises at least one of:

shifting the working curve 14 in the input variable/air excess factor-diagram to the right with respect to the input variable value I, such that the new working curve 14' as a function of the input variable I relates to the former working curve 14 in that: $\lambda_{new}(I)=\lambda(IF-\Delta I)$, wherein $\Delta I$ is the shift in input variable value I;

shifting the working curve 14 in the input variable/air excess factor-diagram upwardly with respect to the air excess factor $\lambda$, such that the new working curve 14' as a function of the input variable value I relates to the former working curve 14 in that: $\lambda_{new}(I)=\lambda(I)+\Delta\lambda$, wherein $\Delta\lambda$ is the shift in air excess factor $\lambda$;

making the slope of the working curve 14 steeper for input variable values I which are lower than the cut-off input variable value $I_c$; and shifting the cut-off input variable value $I_c$ in the input variable/air excess factor-diagram to the right, such that the new cut-off input variable value $I_c'$ relates to the former cut-off input variable value $I_c$ in that: $I_c'>I_c$.

As explained above, another risk of using a fuel gas comprising hydrogen in a premix gas burner 12 is the higher probability of the occurrence of flashbacks. The use of the working curve 14 is aimed at avoiding these flashbacks. An existing working curve 14, e.g. due to a change in external circumstances may become ill-fitted for the new circumstances, meaning that a flashback may occur. Detecting these flashbacks and adapting the existing working curve 14 will additionally optimize the working curve 14, meaning that in future the chance of an occurrence of a flashback is reduced. According to this embodiment, the adaptation of the working curve in response to a flashback occurrence involves moving the working curve 14 away from the flashback limit line 20, making the occurrence of a flashback even less likely. Of course, a combination of these adaptations may be used as well.

In an embodiment, the sensor 22, 28, 32 capable of detecting a signal which is indicative of a flashback comprises a temperature sensor 22 which measures the temperature T of the burner deck 24. A said flashback is determined by an increase $\Delta T$ in the temperature T of the burner deck 24 within a certain time period $\Delta t_0$ which increase is bigger than a preset temperature increase threshold $\Delta T_0$.

In a further elaboration of this embodiment, the time period $\Delta t_0$ may equal 2 seconds and the temperature increase threshold $\Delta T_0$ may equal 100° C. The temperature sensor 22 may be connected to the burner deck 24. For example, the sensor 22 may be a thermocouple which is welded to the burner deck 24.

Thermocouples are reliable and relatively cheap. Consequently, their application as a sensor 22 for detecting flashbacks is preferred. Alternatively to the thermocouple which is welded to the burner deck 24, the sensor 22 may also be embodied as an infrared sensor which is placed at a distance from the burner deck 24 and detects infrared radiation from the burner deck 24.

Additionally or alternatively, the sensor 22, 28, 32 capable of detecting a signal which is indicative of the flashback may be a pressure sensor 28 which measures a pressure p in a supply channel 30 through which supply channel 30 the mixture is supplied to the premix gas burner 12. A flashback is determined by an increase $\Delta p$ in the pressure p in the supply channel 30 within a certain time period $\Delta t_0$ which increase is bigger than a preset pressure increase threshold $\Delta p_0$.

The pressure sensor 28 may be e.g. a pressure transducer.

In yet another alternative or additional embodiment, the sensor 22, 28, 32 capable of detecting a signal which is indicative of a flashback may be a sound sensor 32 which measures a sound intensity level S of the premix gas burner 12. A flashback is determined when the sound intensity level S is higher than a preset sound intensity threshold $S_0$.

When a flashback occurs, the wave front of the flashback flame travels in the upstream direction. Effects of a flashback are e.g. an increase in temperature of the burner deck 24, an increase in pressure in the supply channel 30, and an audible sound. With the sensors 22, 28, 32 described above, each of or any combination of these effects may be monitored. In each of the three alternative embodiments discussed above, one of these effects is monitored. It has been determined that the temperature on the burner deck 24 may rise more than 100° C. within 2 seconds in case of a flashback. The burner deck 24 is therefore well suited to place the temperature sensor 22. The flashback propagating within the supply channel 30 will result in a considerable increase in pressure. The supply channel 30 is therefore well suited to place the pressure sensor 28.

In an embodiment of the method, the air flow rate related values F may be mass flow rate values of the air which is supplied to the premix burner 12. Instead of mass flow rate values, volume flow rate values of the supplied air may be used as the air flow rate related value. Further, the rotational speed of the fan 34 may be used as the air flow rate related value. For example, the rotations per minute of the fan 34 may be used as the air flow rate related value. Optionally, the inlet temperature of the air and/or a pressure difference between the environment and a pressure downstream of the fan 34 in the supply channel 30 may be taken into account. For example, the mass flow rate of the air flow may be calculated based upon air inlet temperature and rotations per minute of the fan 34, an outside environmental pressure and a pressure measured in the supply channel 30.

In an embodiment, the premix gas burner may comprise a mass flow rate determining unit for determining the mass flow rate of the flow of air which is supplied to the supply channel 30 by the fan 34. In this embodiment, the determined actual mass flow rate value of the flow of air may be used as the air flow rate related value F for controlling the actual air excess factor $\lambda_a$. In this embodiment, the electronic controller 26 is configured for controlling supply of the amount of fuel gas in dependence of the mass flow rate value of the supplied air such that the actual air excess factor $\lambda_a$ is varied in accordance with the working curve 14.

The controlling of the flow rate FG of the fuel gas may be effected with a fuel gas control valve 36 which is connected to the electronic controller 26 and which is accommodated in the fuel gas supply 42.

Of course, the electronic controller 26 may also be configured to control the fan 34 so that the air flow rate of the premix burner 12 can be varied, for example in response to a heat demand from a central heating system or a tap water demand.

The various embodiments which are described above may be used implemented independently from one another and may be combined with one another in various ways. The reference numbers used in the detailed description and the claims do not limit the description of the embodiments nor do they limit the claims. The reference numbers are solely used to clarify.

LEGEND

10—central heating boiler
11—heat exchanger
12—gas burner
13—combustion chamber
14—working curve
16—emission limit line
18—blow off limit line
20—flashback limit line
22—temperature sensor
24—burner deck
26—electronic controller
28—pressure sensor
30—supply channel
32—sound sensor
34—fan 36—fuel gas control valve
38—mixing area
40—mixing device
42—fuel gas supply
F—air flow rate related value
$F_a$—actual air flow rate related value
$F_c$—cut-off air flow rate
FG—flow rate of the fuel gas
I—input variable
$I_a$—actual value of the input variable I
S—sound intensity level
$S_0$—sound intensity threshold
p—pressure
T—temperature
ΔF—shift in air flow rate related value
Δp—increase in pressure
$Δp_0$—pressure increase threshold
$Δt_0$—time period
ΔT—increase in temperature
$ΔT_0$—temperature increase threshold
Δλ—shift in air excess factor
$λ_a$—actual air excess factor
$λ_d(I)$—desired air excess factor at a given value of the input variable
$λ_{ELL}$—emission limit line air excess factor
$λ_{BOLL}$—blow off limit line air excess factor

The invention claimed is:

1. A premix gas burner comprising:
a burner housing with a burner deck;
a supply channel configured to supply a combustible mixture to the premix gas burner;
a fan configured to supply air or the combustible mixture to the supply channel;
a fuel gas supply including a fuel gas control valve configured to supply a fuel gas to the supply channel;
a mixing area configured to mix the air and the fuel gas so as to form the combustible mixture; and
an electronic controller configured to control the rotational speed of the fan and the fuel gas control valve;
wherein the electronic controller comprises a memory in which a desired air excess factor relation ($λ_d(I)$) of the mixture is stored which defines the relation between a desired air excess factor and a chosen input variable (I), wherein the input variable (I) is one of the following parameters:
a heat demand related value (Q);
an air flow rate related value (F) indicative of a flow rate of the flow of air; or
a fuel gas flow rate related value (FG) indicative of an actual fuel gas flow rate,
wherein the desired air excess factor ($λ_d(I)$) is not a constant factor but varies for different values of the input variable (I),
wherein the desired air excess factor ($λ_d(I)$) is defined as a ratio of the desired air to fuel gas ratio of a mixture relative to a stoichiometric air to fuel gas ratio;
wherein the electronic controller is configured to:
determine an actual value ($I_a$) of the input variable (I);
determine an actual air excess factor ($λ_a$), wherein the actual air excess factor ($λ_a$) is defined as the ratio of the actual air to fuel gas ratio of the mixture relative to the stoichiometric air to fuel gas ratio;
control the fuel gas flow rate (FG) and/or the air flow rate (F) such that:
the actual air excess factor ($λ_a$) converges towards the desired air excess factor ($λ_d(I)$) belonging to the actual value ($I_a$) of the input variable (I); and that
the heat generated with the premix burner remains in accordance with an acquired heat demand related value (Q).

2. The premix gas burner according to claim 1, wherein the electronic controller is configured to control the air flow rate (F) in dependence of the heat demand related value (Q), and wherein the fuel gas flow rate (FG) is controlled in dependence of the actual air flow rate related value ($F_a$), wherein the chosen input value (I) of desired air excess factor relation ($λ_d(I)$) of the mixture is the air flow rate related value (F) indicative of a flow rate of the flow of air.

3. The premix gas burner according to claim 1, wherein the electronic controller is configured to control the fuel gas flow rate (FG) in dependence of the heat demand related value (Q), and wherein the air flow rate (F) is controlled in dependence of the actual fuel gas flow rate related value ($FG_a$), wherein the chosen input variable (I) of desired air excess factor relation ($λ_d(I)$) of the mixture is the actual fuel gas flow rate related value ($FG_a$) indicative of a flow rate of the fuel gas.

4. The premix gas burner according to claim 1, wherein the electronic controller is configured to directly controlling both the fuel gas flow rate (FG) as well as the air flow rate (F) in dependence of the heat demand related value (Q), wherein the chosen input variable (I) of desired air excess factor relation ($λ_d(I)$) of the mixture is the heat demand related value (Q).

5. The premix gas burner according to claim 1, wherein the stored desired air excess factor relation ($λ_d(I)$) of the mixture as a function of at least the input variable value (I) defines a working curve in an input variable/air excess factor-diagram in which the input variable value (I) is defined on a horizontal axis and the desired air excess factor ($λ_d(I)$) is defined on a vertical axis, wherein the working curve extends in a work area which, along a working range of the input variable value (I), is bounded at an underside by an emission limit line, at an upper side by a blow off limit line, and at a left-hand side by a flashback limit line, which flashback limit line strictly increases when the input variable value (I) decreases.

6. The premix gas burner according to claim 5, further comprising:
a temperature sensor configured to detect a signal which is indicative of a burner deck temperature (T);
wherein the electronic controller is configured to adapt an existing working curve in response to a detection of a too low or too high burner deck temperature (T) at a given input variable value (I) so as to obtain an adapted working curve.

7. The premix gas burner according to claim 5, further comprising:
a sensor configured to detect a signal which is indicative of a flashback;
wherein the electronic controller is configured to adapt the existing working curve in response to a detection of a flashback so as to obtain an adapted working curve.

8. The premix gas burner of claim 7, wherein the sensor comprises at least one of:
a temperature sensor configured to sense a temperature (T) of the burner deck;
a pressure sensor configured to sense a pressure (p) in the supply channel; and
a sound sensor configured to measure a sound intensity level (S) of the premix gas burner.

9. The premix gas burner according to claim 1, further comprising a mass flow determining unit configured to determine the mass flow of the air which is supplied to the supply channel by the fan, wherein a determined actual mass flow value of the air is the air flow rate related value (F), wherein the controller is configured to supply of an amount of fuel gas in dependence of the mass flow value of the supplied air such that the air excess factor ($\lambda$) is varied in accordance with a working curve.

10. A boiler for heating water, comprising:
   the premix gas burner according to claim 1; and
   a heat exchanger having a combustion chamber,
      wherein the burner deck of the premix gas burner is positioned in the combustion chamber.

* * * * *